(12) United States Patent
Horning et al.

(10) Patent No.: US 11,177,599 B2
(45) Date of Patent: Nov. 16, 2021

(54) POWER CONNECTOR FOR A BUS BAR

(71) Applicant: TE CONNECTIVITY CORPORATION, Berwyn, PA (US)

(72) Inventors: Michael James Horning, Landisville, PA (US); Howard Wallace Andrews, Jr., Hummelstown, PA (US); Brian Patrick Costello, Scotts Valley, CA (US); David Patrick Orris, Middletown, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 16/739,950

(22) Filed: Jan. 10, 2020

(65) Prior Publication Data

US 2020/0243997 A1 Jul. 30, 2020

Related U.S. Application Data

(60) Provisional application No. 62/797,757, filed on Jan. 28, 2019.

(51) Int. Cl.
*H01R 13/11* (2006.01)
*H01R 13/502* (2006.01)
*H01R 13/426* (2006.01)

(52) U.S. Cl.
CPC ......... *H01R 13/113* (2013.01); *H01R 13/426* (2013.01); *H01R 13/502* (2013.01)

(58) Field of Classification Search
CPC .. H01R 13/113; H01R 13/426; H01R 13/502; H01R 13/6464; H01R 13/6466; H01R 24/64; H01R 24/66

USPC ........................................................ 439/676
See application file for complete search history.

(56) References Cited

U.S. PATENT DOCUMENTS

| | | | | |
|---|---|---|---|---|
| 4,878,862 A * | 11/1989 | Wise | ..................... | H01R 25/162 439/787 |
| 4,981,449 A * | 1/1991 | Buchter | ............... | H01R 25/162 439/724 |
| 4,983,132 A * | 1/1991 | Weidler | ............... | H01R 25/162 439/786 |
| 4,995,814 A * | 2/1991 | Weidler | ............... | H01R 25/162 439/61 |
| 5,421,751 A * | 6/1995 | Bennett | ................ | H01R 13/187 439/843 |
| 5,431,576 A * | 7/1995 | Matthews | ............ | H01R 13/113 439/247 |

(Continued)

OTHER PUBLICATIONS

TE Connectivity Corporation. Contact Band Strip, C-192002 Rev. N., A2, Jan. 17, 2018.

*Primary Examiner* — Peter G Leigh

(57) ABSTRACT

A power connector includes a housing having a mating slot at a front having terminal channels holding power terminals between the slot and the corresponding side of the housing. Each power terminal includes a plate extending from the slot through a rear of the housing to an exterior of the housing for termination to a corresponding power element. The power terminal has a contact array of contacts discrete from and coupled to the plate. Each contact has a plate interface electrically coupled to the plate and a bus bar interface configured to be electrically coupled to a corresponding rail of the bus bar. The contacts are arranged along a corresponding side of the slot for interfacing with the bus bar.

21 Claims, 11 Drawing Sheets

(56) References Cited

U.S. PATENT DOCUMENTS

| | | | |
|---|---|---|---|
| 7,581,972 B2 * | 9/2009 | Daamen | H01R 13/6315 |
| | | | 439/249 |
| 7,997,910 B2 * | 8/2011 | Myers | H01R 25/142 |
| | | | 439/121 |
| 8,388,389 B2 * | 3/2013 | Costello | H01R 13/18 |
| | | | 439/839 |
| 8,911,250 B2 * | 12/2014 | Ehlen | H01R 13/6315 |
| | | | 439/251 |
| 9,070,990 B2 * | 6/2015 | Flickinger | H01R 4/10 |
| 9,680,236 B2 * | 6/2017 | Ngo | H01R 12/724 |
| 9,800,004 B1 * | 10/2017 | Schepis | H01R 25/162 |
| 9,882,321 B1 * | 1/2018 | Hibbs | H01R 24/60 |
| 10,424,887 B2 * | 9/2019 | Hirschman | H01R 12/7088 |

\* cited by examiner

POWER CONNECTOR FOR A BUS BAR

CROSS REFERENCE TO RELATED APPLICATIONS

This application claims benefit to U.S. Provisional Application No. 62/797,757, filed Jan. 28, 2019, titled "POWER CONNECTOR FOR A BUS BAR", the subject matter of which is herein incorporated by reference in its entirety.

BACKGROUND OF THE INVENTION

The subject matter herein relates generally to power connectors.

Power connectors are used in systems, such as communication systems for powering components of the system. For example, power connectors are used in networks, such as servers, switches and the like for powering the server or switch components. In some known systems, the components are held in a rack and the power system includes a bus bar to supply power for the components held in the rack. The power connectors tap into the bus bar to take or supply power from the bus bar for the components. Some known systems include a tap bus bar electrically connected to the power connector. Some system developers require power connectors to have certain height requirements, such as to fit within a rack unit or open rack unit (for example, 48 mm) height requirement. Some known systems have high power demands, such as requiring high current and/or high voltage power connections between the bus bar other components of the system. For example, some power connectors may be designed for up to 500 amp connections or more.

A need remains for a low profile, high current power connector, which may have a separable mating interface with a bus bar and/or be variably positionable along a bus bar for system design flexibility.

BRIEF DESCRIPTION OF THE INVENTION

In one embodiment, a power connector is provided including a housing having a front and a rear, a first side and a second side between the front and the rear, and a first end and a second end between the front and the rear. The housing has a mating slot at the front configured to receive a bus bar. The housing has a first terminal channel between the slot and the first side and a second terminal channel between the slot and the second side. A first power terminal is received in the first terminal channel. The first power terminal has a first plate extending from the slot through the rear of the housing to an exterior of the housing for termination to a first power element. The first power terminal has a first contact array of first contacts discrete from and coupled to the first plate. Each first contact has a plate interface electrically coupled to the first plate and a bus bar interface configured to be electrically coupled to a first rail of the bus bar. The first contacts are arranged along a first side of the slot for interfacing with the bus bar. A second power terminal is received in the second terminal channel. The second power terminal has a second plate extending from the slot through the rear of the housing to the exterior of the housing for termination to a second power element. The second power terminal has a second contact array of second contacts discrete from and coupled to the second plate. Each second contact has a plate interface electrically coupled to the second plate and a bus bar interface configured to be electrically coupled to a second rail of the bus bar. The second contacts are arranged along a second side of the slot for interfacing with the bus bar.

In another embodiment, a power connector is provided including a housing having a front and a rear, a first side and a second side between the front and the rear, and a first end and a second end between the front and the rear. The housing has a height of at most 48 mm between the first end and the second end. The housing has a vertically oriented mating slot configured to receive a vertically oriented bus bar. The mating slot is open at the front, open at the first end, and open at the second end. The housing has a first terminal channel between the slot and the first side and a second terminal channel between the slot and the second side. A first power terminal is received in the first terminal channel. The first power terminal has a first plate extending from the slot through the rear of the housing to an exterior of the housing for termination to a first power element. The first power terminal has a first contact array of first contacts discrete from and coupled to the first plate. Each first contact has a plate interface electrically coupled to the first plate and a bus bar interface configured to be electrically coupled to a first rail of the bus bar. The first contacts are arranged along a first side of the slot for interfacing with the bus bar. A second power terminal is received in the second terminal channel. The second power terminal has a second plate extending from the slot through the rear of the housing to the exterior of the housing for termination to a second power element. The second power terminal has a second contact array of second contacts discrete from and coupled to the second plate. Each second contact has a plate interface electrically coupled to the second plate and a bus bar interface configured to be electrically coupled to a second rail of the bus bar. The second contacts are arranged along a second side of the slot for interfacing with the bus bar. The bus bar interface of the first power terminal defines a separable mating interface with a first rail of the bus bar and the bus bar interface of the second power terminal defines a separable mating interface with a second rail of the bus bar configured to convey greater than 400 amps.

In a further embodiment, a power system is provided for a bus bar having a first bus rail and a second bus rail. The power system includes a first power element having a first mating interface and a second power element having a second mating interface. A power connector is configured to be mated to the first bus rail and the second bus rail. The power connector includes a housing having a front and a rear, a first side and a second side between the front and the rear, and a first end and a second end between the front and the rear. The housing has a mating slot at the front configured to receive a bus bar. The housing has a first terminal channel between the slot and the first side and a second terminal channel between the slot and the second side. A first power terminal is received in the first terminal channel. The first power terminal has a first plate extending from the slot through the rear of the housing to an exterior of the housing for termination to a first power element. The first power terminal has a first contact array of first contacts discrete from and coupled to the first plate. Each first contact has a plate interface electrically coupled to the first plate and a bus bar interface configured to be electrically coupled to a first rail of the bus bar. The first contacts are arranged along a first side of the slot for interfacing with the bus bar. A second power terminal is received in the second terminal channel. The second power terminal has a second plate extending from the slot through the rear of the housing to the exterior of the housing for termination to a second power element. The second power terminal has a second contact array of second contacts discrete from and coupled to the second plate. Each second contact has a plate interface electrically coupled to the second plate and a bus bar interface configured to be electrically coupled to a second rail of the bus bar. The second contacts are arranged along a second side of the slot for interfacing with the bus bar. The first power terminal electrically connects the first power element to the first rail and the second power terminal electrically connects the second power element to the second rail at a separable mating interface with the bus bar.

DETAILED DESCRIPTION OF THE INVENTION

Figure 1:
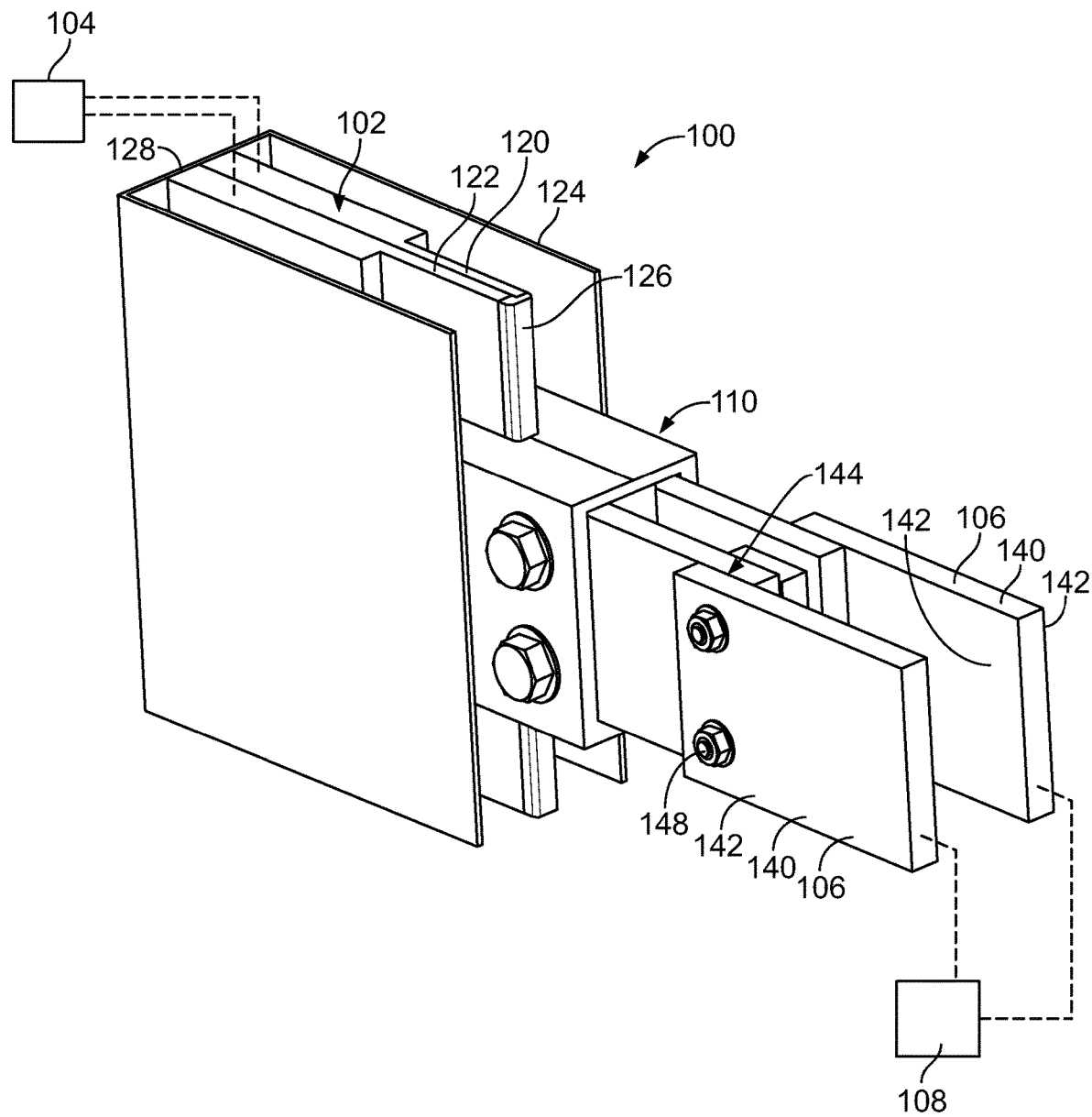
FIG. 1 illustrates a power system showing a power connector in accordance with an exemplary embodiment.

FIG. 1 illustrates a power system 100 in accordance with an exemplary embodiment. The power system 100 includes a bus bar 102 electrically connected to a first component 104 and one or more power elements 106 electrically connected to a second component 108. A power connector 110 electrically connects the power elements 106 to the bus bar 102. In various embodiments, the power connector 110 may be used as a supply power connector to supply power to the bus bar 102. In other embodiments, the power connector 110 may be used as a tap power connector to tap into a power supply of the distribution bus bar 102.

In various embodiments, the power system 100 may be part of a data communication system, such as a data center, switch, router, server, hub, network, or data storage system. For example, the component 108 may include a rack or cabinet. Cable assemblies may be routed between various components of the communication system. The communication system may include a plurality of shelves or drawers stacked within the rack. Components of the communication system may be powered by the bus bar 102, such as through the power connector 110. The communication system may include one or more switches to provide electrical switching within the communication system. Various panel mount connector assemblies may be electrically connected to the switch with cables routed from the switch to other panel mount connector assemblies at various other shelves within the communication system. In various embodiments, the communication system servers configured to be electrically connected to corresponding connector assemblies and may be powered by the power connector. The servers may be electrically connected to the switch by the cables.

The bus bar 102 includes a first bus rail 120 and a second bus rail 122. For example, the first bus rail 120 may be a positive rail and the second bus rail 122 may be a negative rail. The bus bar 102 includes a cover 124 that covers the bus rails 120, 122. The bus bar 102 extends between a front 126 and a rear 128. The power connector 110 is coupled to the rear 128 of the bus bar 102. Optionally, the bus bar 102 may be oriented vertically with the bus rails 120, 122 extending vertically. Other orientations are possible in alternative embodiments. In an exemplary embodiment, each bus rail 120, 122 includes a metal plate having sides extending to a mating edge. Each bus rail 120, 122 may be a copper plate. In various embodiments, the bus rails 120, 122 may be arranged back-to-back as a single bus bar. The bus bar 102 may be a dual pole bus bar. For example, the bus rails 120, 122 may be laminated together and electrically isolated having opposite polarity carrying positive and negative charges. In other embodiments, the bus bar 102 may be a single pole bus bar with the first and second bus rails 120, 122 having a single polarity. The power connector 110 is coupled to the mating edges at the sides of the bus rails 120, 122.

In the illustrated embodiment, the power elements 106 include metal plates 140 having sides 142. For example, the plate 140 may be a copper plate. The power element 106 has a mating interface 144 at an end of the plate 140. The mating interface 144 is configured to be mated with the power connector 110. In the illustrated embodiment, the mating interface 144 is defined by an end of the plate 140. The plate 140 includes openings (not shown) at the mating interface 144 for receiving a fastener 148 to mechanically and electrically secure the power element 106 and the power connector 110. In an exemplary embodiment, the power element 106 may include a second mating interface (not shown) at the opposite end to mechanically and electrically connect the power element 106 to another component, such as at the component 108. In the illustrated embodiment, the plate 140 is planar and rectangular. However, the power element 106 may have other shapes in alternative embodiments, such as being formed or bent into an alternative shape. In the illustrated embodiment, the plates 140 are oriented vertically. Other orientations are possible in alternative embodiments. In various alternative embodiments, the power elements 106 may be power wires configured to be terminated to the power connector 110 rather than a metal plate. The metal plate 140 may be a bus bar.

Figure 2:
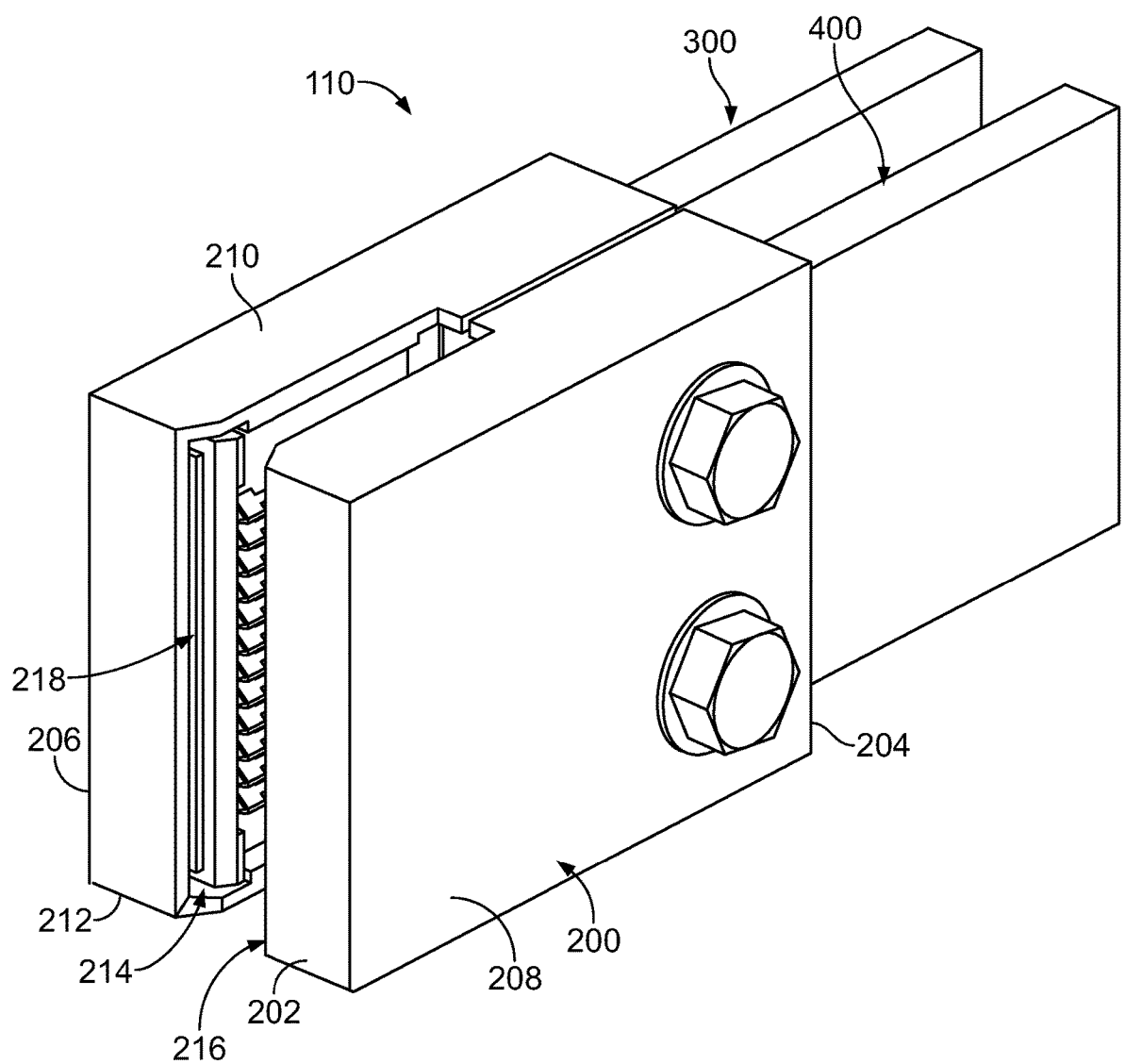
FIG. 2 is a front perspective view of the power connector in accordance with an exemplary embodiment.

FIG. 2 is a front perspective view of the power connector 110 in accordance with an exemplary embodiment. The power connector 110 includes a housing 200 holding a first power terminal 300 and a second power terminal 400. The first power terminal 300 is configured to be electrically connected to the first bus rail 120 (shown in FIG. 1). The second power terminal 400 is configured to be electrically connected to the second bus rail 122 (shown in FIG. 1). The first and second power terminals 300, 400 may be similar and include similar components or features. While the first power terminal 300 is described in greater detailed throughout the specification than the second power terminal 400, the second power terminal 400 may include similar or identical components.

The housing 200 has a front 202, a rear 204, a first side 206, a second side 208, a first end 210, and a second end 212. In the illustrated embodiment, the housing 200 is generally box-shaped; however, the housing 200 may have other shapes in alternative embodiments. The sides 206, 208 extend between the front 202 and the rear 204. The ends 210, 212 extend between the front 202 and the rear 204. Optionally, the first end 210 may define a top end and the second end 212 may define a bottom end; however, the power connector 110 may have other orientations in alternative embodiments, such as where the first side 206 is a top side and the second side 208 is a bottom side.

The housing 200 includes a first terminal channel 214 that receives the first power terminal 300 and a second terminal channel 216 that receives the second power terminal 400. The terminal channels 214, 216 are open at the rear 204 to receive the power terminals 300, 400. The power terminals 300, 400 extend from the housing 200 through the rear 204, such as for mating with the power elements 106 (shown in FIG. 1). The power terminals 300, 400 may be held in the terminal channels 214, 216 by an interference fit in various embodiments.

In an exemplary embodiment, the housing 200 includes a mating slot 218 at the front 202. The mating slot 218 is vertically oriented through the housing 200. The mating slot 218 is open at the front 202 to receive the bus bar 102. The mating slot 218 is open at the first end 210 and at the second end 212. The first and second power terminals 300, 400 extend to the front 202 of the housing 200. The first and second power terminals 300, 400 extend to the mating slot 218 to interface with the bus bar 102. The first power terminal 300 is located in the first terminal channel 214 between the mating slot 218 and the first side 206. The second power terminal 400 is located in the second terminal channel 216 between the mating slot 218 and the second side 208.

Figure 3:
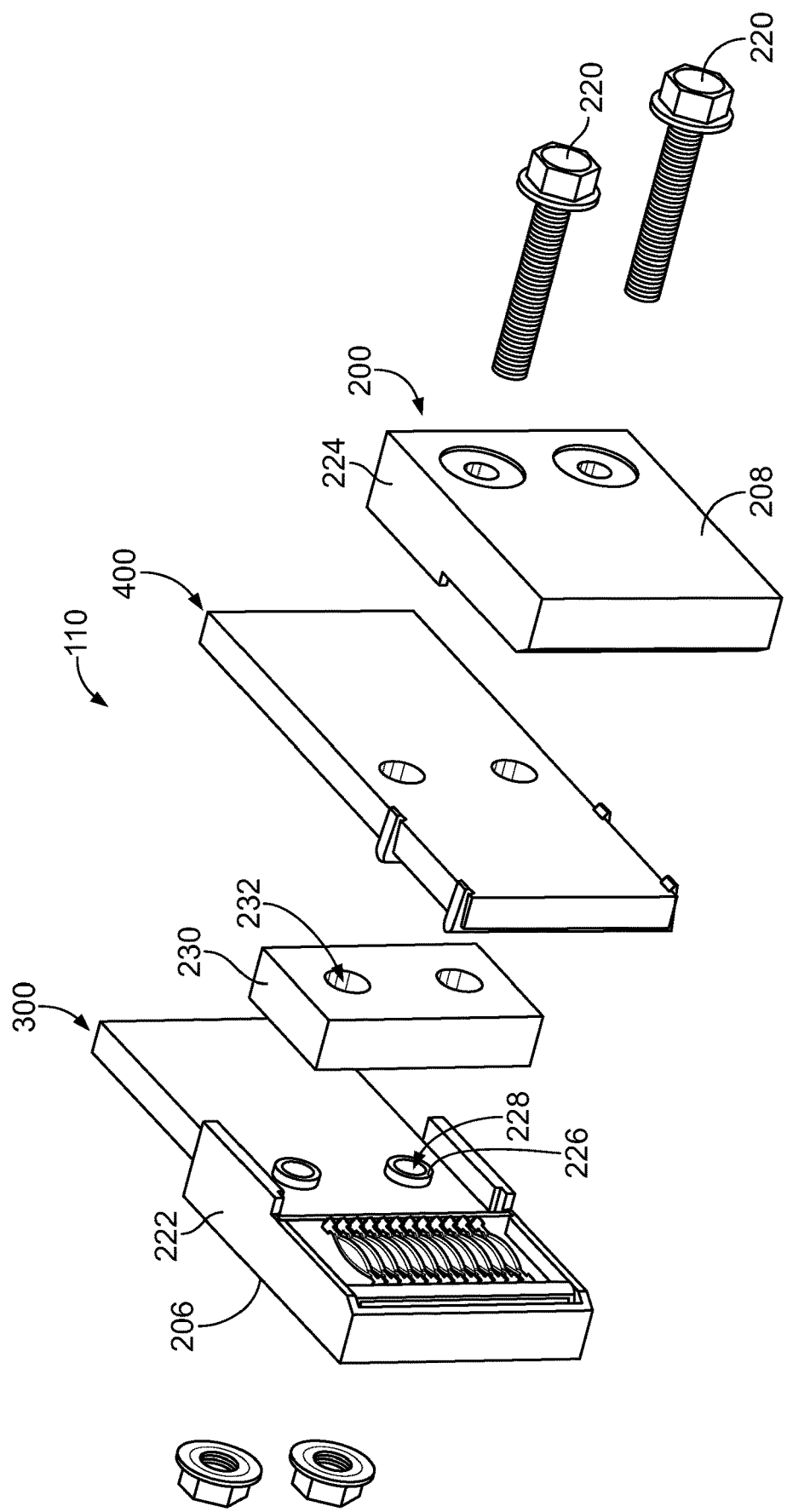
FIG. 3 is an exploded view of the power connector in accordance with an exemplary embodiment.

FIG. 3 is an exploded view of the power connector 110 in accordance with an exemplary embodiment. In an exemplary embodiment, the housing 200 is a multipiece housing configured to be assembled together using fasteners 220, such as threaded fasteners, rivets, and the like. For example, the housing 200 includes a first shell 222 and a second shell 224. The first shell 222 forms the first side 206 and the second shell 224 forms the second side 208. The first and second shells 222, 224 are coupled together to form a cavity that receives the power terminals 300, 400. Optionally, the shells 222, 224 may be mirrored halves. In various embodiments, the shells 222, 224 include protrusions 226 extending into the cavity. The protrusions 226 have openings 228 extending therethrough. The fasteners 220 pass through the openings 228 and the protrusions 226. In the illustrated embodiment, the fasteners 220 are threaded bolts having corresponding threaded nuts configured to be secured to the end of the threaded bolt. Other types of fasteners may be used in alternative embodiments.

In an exemplary embodiment, the power connector 110 includes a spacer 230 positioned between the first power terminal 300 and the second power terminal 400. The spacer 230 is manufactured from a dielectric material, such as a plastic material, a rubber material, and the like. The spacer 230 electrically isolates the first power terminal 300 from the second power terminal 400. The spacer 230 includes openings 232 configured to be aligned with the protrusions 226 and the openings 228. The openings 228 receive the fasteners 220. The spacer 230 is sandwiched between the power terminals 300, 400 and the shells 222, 224 when the power connector 110 is assembled and the fasteners 220 are tightened.

Figure 4:
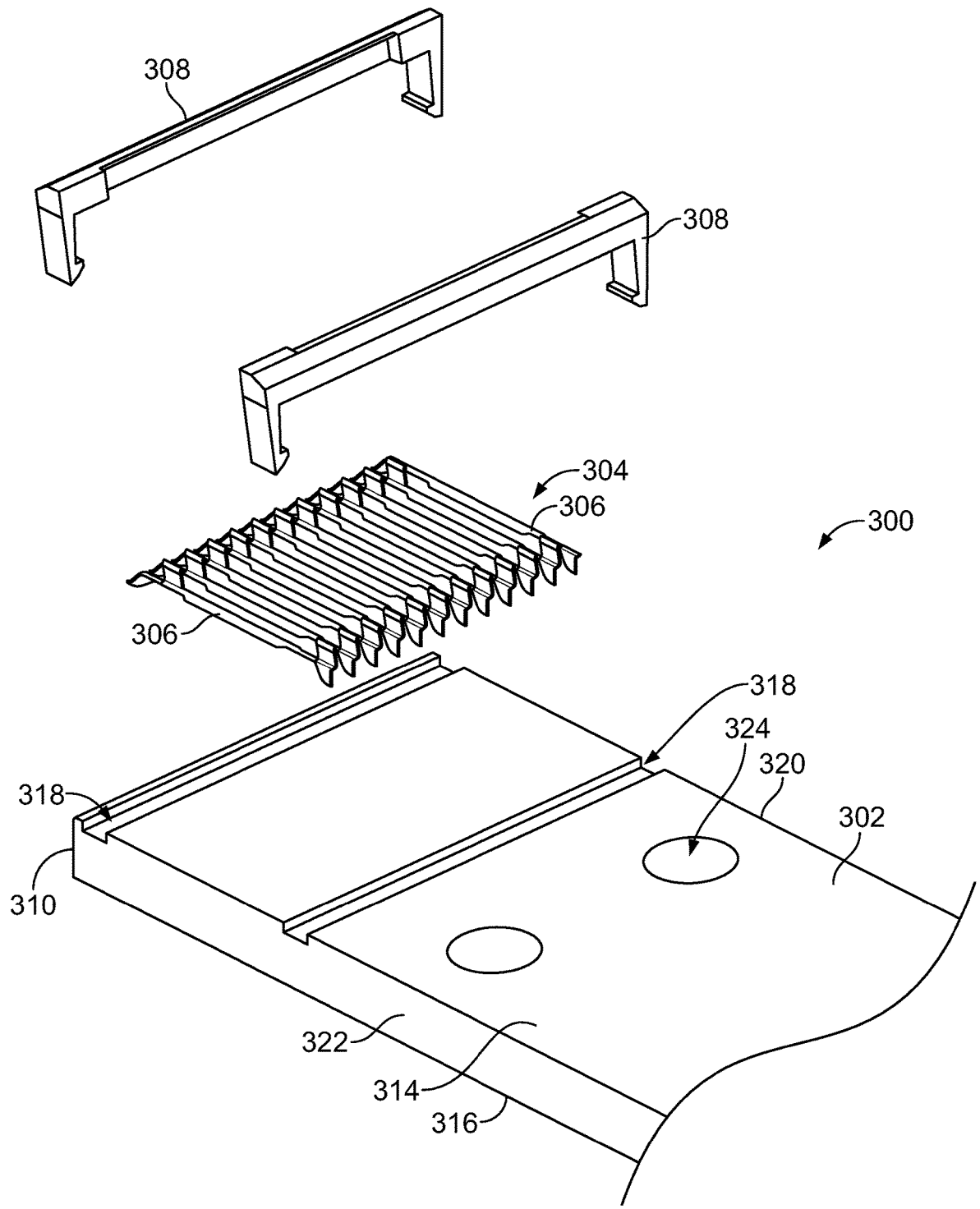
FIG. 4 is an exploded view of a power terminal of the power connector in accordance with an exemplary embodiment.

FIG. 4 is an exploded view of the power terminal 300 in accordance with an exemplary embodiment. The power terminal 300 includes a plate 302 and a contact array 304 of contacts 306 discrete from and coupled to the plate 302. The contact array 304 includes retainer clips 308 used to secure the contacts 306 to the plate 302. In the illustrated embodiment, the retainer clips 308 are separate and discrete from the contacts 306. However, in alternative embodiments, the retainer clips 308 may be integral with the contacts 306. For example, the retainer clips 308 may be stamped and formed with the contacts 306 as part of a carrier structure for the contacts 306. In other various embodiments, the contacts 306 may be secured to the plate 302 without the use of retainer clips. For example, the contacts 306 may be welded to the plate 302 or secured to the plate using dovetails formed in the plate 302 or other securing features.

The plate 302 is a metal plate, such as a copper plate. Optionally, the plate 302 may be a planar rectangular plate; however, the plate 302 may have other shapes, including bends, steps, and the like, in alternative embodiments. The plate 302 has a front 310. The contact array 304 is configured to be coupled to the plate 302 proximate to the front 310. The plate 302 has an inner side 314 and an outer side 316 opposite the inner side 314. The inner side 314 is configured to face the mating slot 218 (shown in FIG. 2). The contact array 304 is configured to be coupled to the inner side 314. In an exemplary embodiment, the plate 302 includes grooves 318 along the inner side 314 that receive the retainer clips 308. The plate 302 includes a first end 320 and a second end 322. In various embodiments, the first end 320 is a top and the second end 322 is a bottom of the plate 302. In an exemplary embodiment, the plate 302 includes openings 324. The openings 324 receive the fasteners 220 (shown in FIG. 3). The plate 302 is manufactured from a copper material and is highly conductive. The plate 302 has a high current carrying capacity. The plate 302 is thick and wide to carry high current, such as in excess of 400 amps. In various embodiments, the plate 302 may be configured to carry current in excess of 500 amps.

Figure 5:
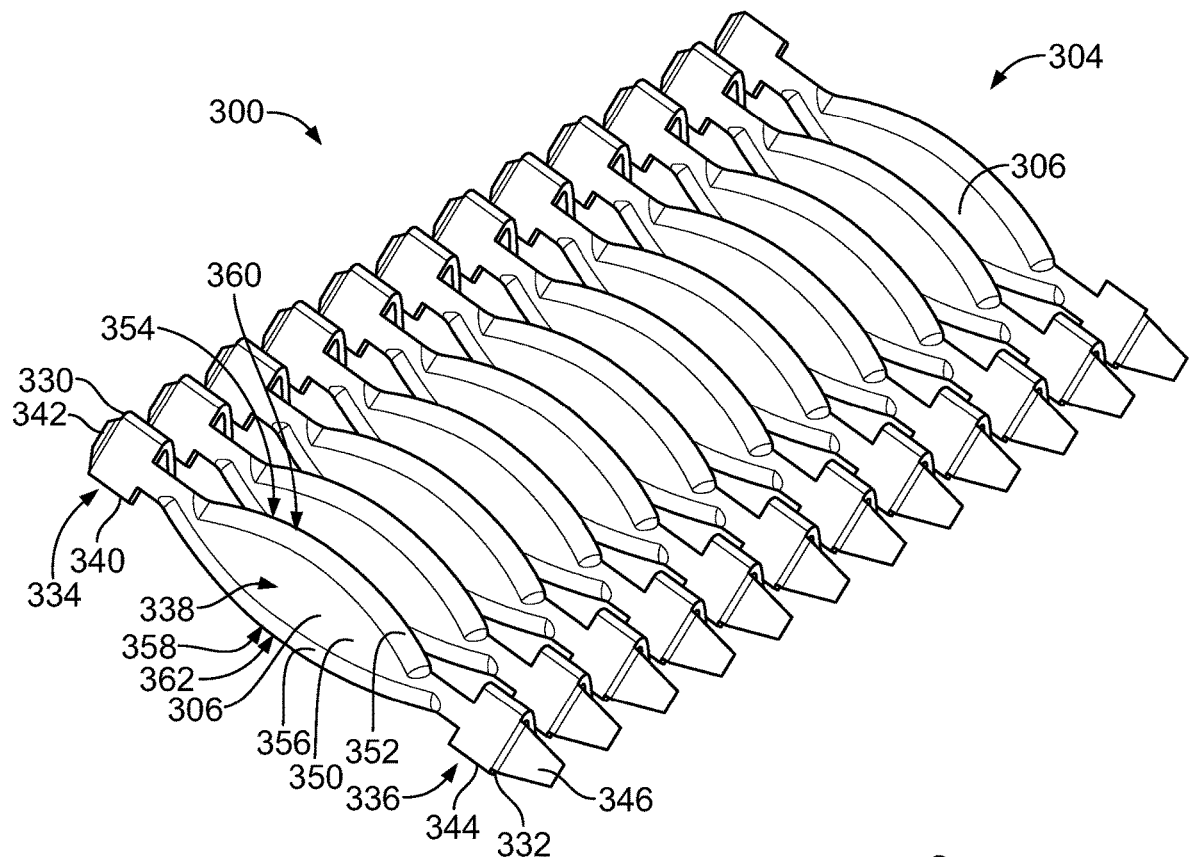
FIG. 5 is a perspective view of a portion of a contact array of the power terminal in accordance with an exemplary embodiment.

FIG. 5 is a perspective view of a portion of the contact array 304 of the power terminal 300. FIG. 5 illustrates a plurality of the contacts 306 arranged in a stacked configuration. In an exemplary embodiment, the contacts 306 are stamped and formed contacts. In an exemplary embodiment, the contacts 306 are integral with each other. For example, the contacts 306 are connected at the ends.

Each contact 306 extends between a front 330 and a rear 332. The contact 306 has a mounting bracket 334 at the front 330, a mounting bracket 336 at the rear 332 and a contact portion 338 in the middle between the mounting brackets 334, 336. The contact portion 338 is configured to electrically connect to the plate 302 (shown in FIG. 4) and electrically connect to the bus bar 102 (shown in FIG. 1). The mounting brackets 334 include front feet 340 configured to be mounted to the plate 302 and front mounting tabs 342 configured to be mounted to the corresponding retainer clip 308 (shown in FIG. 4). The mounting brackets 336 include rear feet 344 configured to be mounted to the plate 302 and a rear mounting tabs 346 configured to be mounted to the corresponding retainer clip 308. In an exemplary embodiment, the mounting brackets 334 may be integral with each other and the mounting brackets 336 may be integral with each other.

The contact portion 338 includes a center beam 350, a first tab 352 extending from the center beam 350 at a first end 354 of the center beam 350, and a second tab 356 extending from the center beam 350 at a second end 358 of the center beam 350. The first and second tabs 352, 356 are bent or folded inward from the center beam 350. Optionally, the first and second ends 354, 358 may be curved such that the first and second tabs 352, 356 have a curved profile. However, the first and second tabs 352, 356 may be planar in alternative embodiments.

In an exemplary embodiment, the first tab 352 defines a bus bar interface 360 of the contact 306 and the second tab 356 finds a plate interface 362 of the contact 306. The contact 306 directly engages the bus bar 102 at the bus bar interface 360. In an exemplary embodiment, the bus bar interface 360 is a separable mating interface. The contact 306 directly engages the plate 302 at the plate interface 362. In an exemplary embodiment, the plate interface 362 is a separable mating interface with the contacts 306 being discrete and separate from the plate 302. Optionally, the plate interfaces 362 of the contacts 306 are offset from the bus bar interfaces 360 of the contacts 306. For example, the contacts 306 may be arranged at non-orthogonal angles to the plate 302. For example, the mounting brackets 334, 336 may orient the contact portion 338 at an angle, such as approximately a 45° angle. In an exemplary embodiment, the contacts 306 are louvered contacts arranged in a stacked configuration with each of the contacts 306 angled and overlapping each other in a louvered arrangement.

Figure 6:
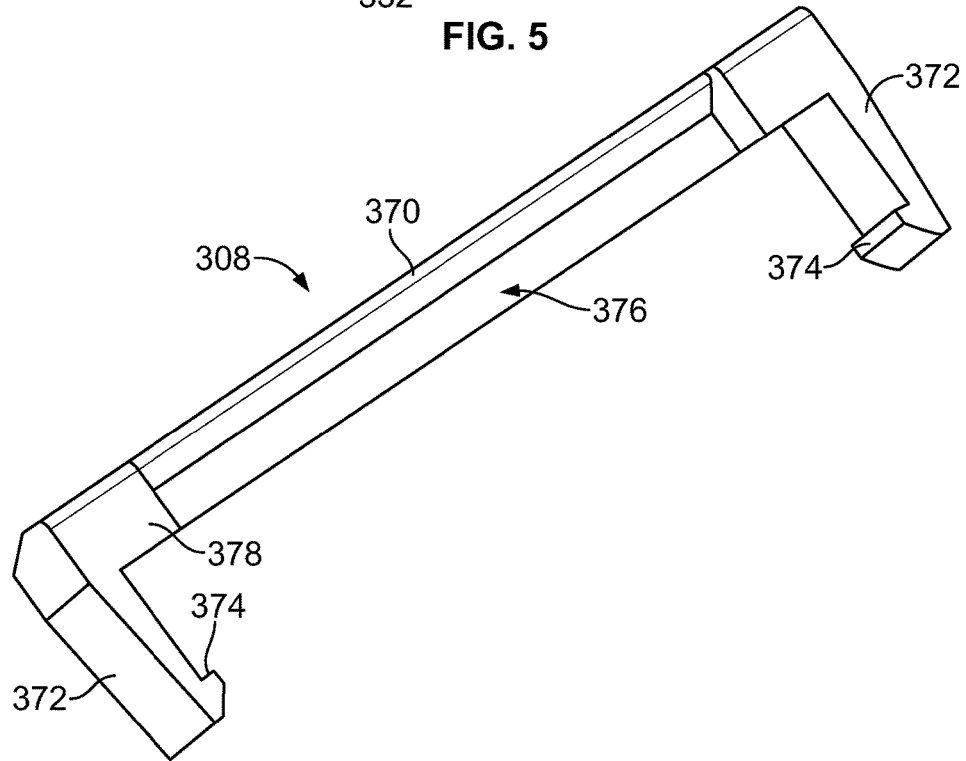
FIG. 6 is a perspective view of a retainer clip of the contact array in accordance with an exemplary embodiment.

FIG. 6 is a perspective view of the retainer clip 308 in accordance with an exemplary embodiment. The retainer clip includes a contact support arm 370 extending between plate mounting arms 372. The plate mounting arms 372 include latching elements 374 configured to secure the plate mounting arms 372 to the plate 302. In the illustrated embodiment, the plate mounting arms 372 extend generally perpendicular to the contact support arm 370; however, the plate mounting arms 372 may extend at other angles in alternative embodiments. The contact support arm 370 includes a pocket 376 at an inner side 378 of the contact support arm 370. The pocket 376 is configured to receive portions of the contacts 306 (shown in FIG. 5). For example, the pocket 376 receives corresponding mounting tabs 342, 346 of the contacts 306.

Figure 7:
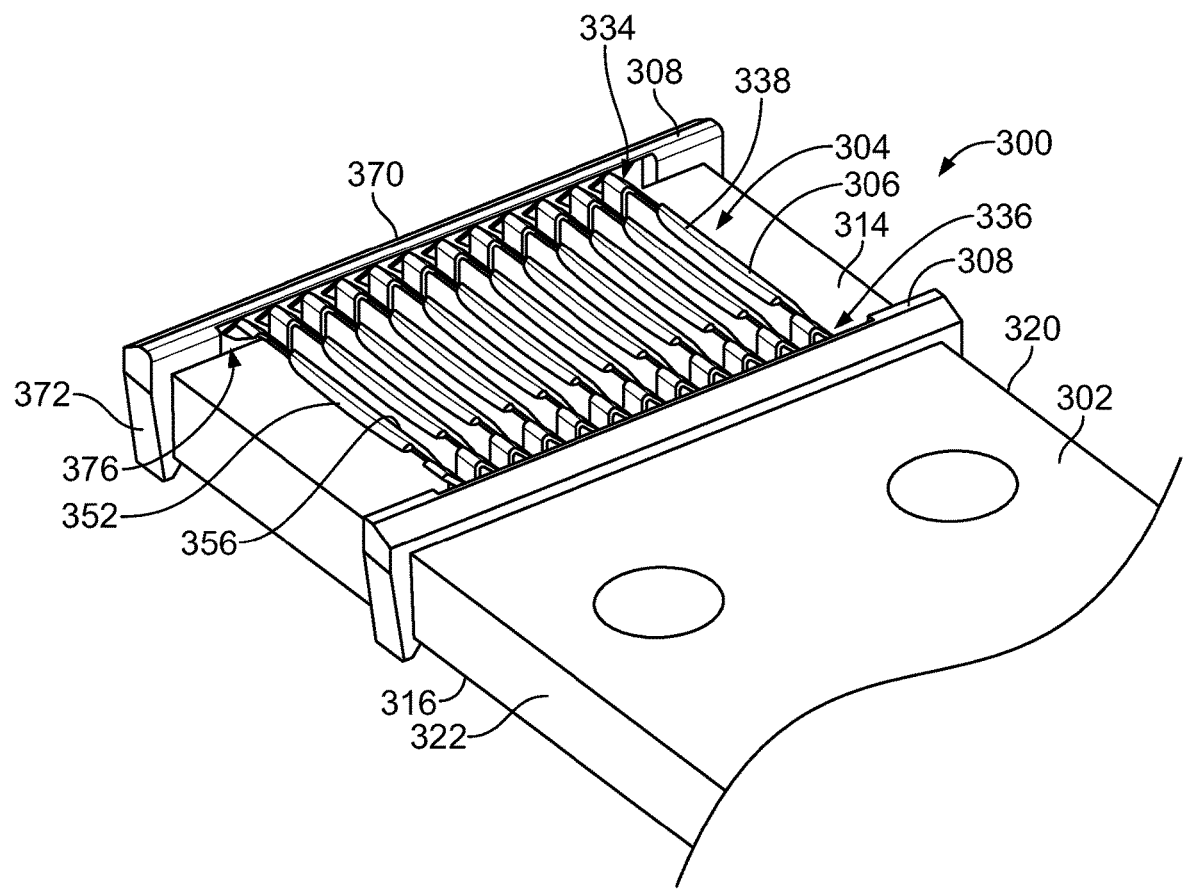
FIG. 7 is a perspective view of a portion of the power terminal in accordance with an exemplary embodiment.
Figure 8:
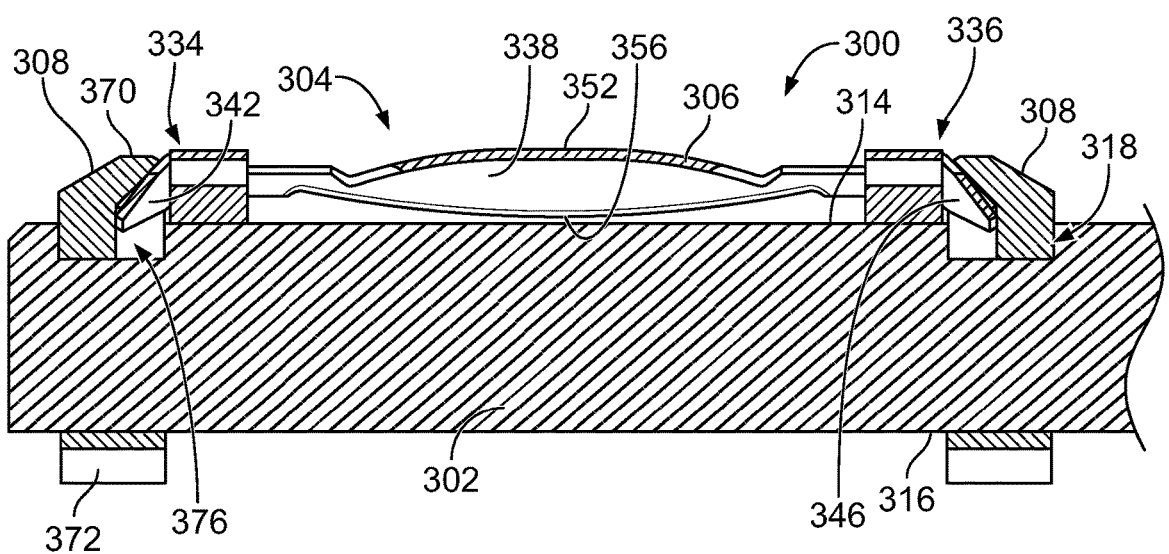
FIG. 8 is a cross-sectional view of the power terminal in accordance with an exemplary embodiment.

FIG. 7 is a perspective view of a portion of the power terminal 300 in accordance with an exemplary embodiment. FIG. 8 is a cross-sectional view of the power terminal 300 in accordance with an exemplary embodiment. When assembled, the contact array 304 is coupled to the plate 302. The contacts 306 are arranged along the inner side 314 of the plate 302. The contact portions 338 face and may engage the inner side 314 of the plate 302. The mounting brackets 334, 336 are coupled to the plate 302. The mounting brackets 334, 336 are coupled to the retainer clips 308. For example, the mounting tabs 342, 346 are received in the pockets 376 of the retainer clips 308.

When assembled, the contact support arms 370 of the retainer clips 308 are received in corresponding grooves 318 of the plate 302. The plate mounting arms 372 extend along the ends 320, 322 of the plate 302 and are secured to the outer side 316 of the plate 302. The retainer clip 308 may be secured to the plate 302 by other means in alternative embodiments. The retainer clip 308 positions and secures the contacts 306 relative to the plate 302 to create an interface between the bus bar 102 and the plate 302.

A plurality of the contacts 306 are provided to create many current paths between the bus bar 102 and the plate 302 to create a low resistance high current path between the bus bar 102 and the plate 302. The tabs 352, 356 are elongated to create elongated mating interfaces for low resistance high current paths between the bus bar 102 and the plate 302.

Figure 9:
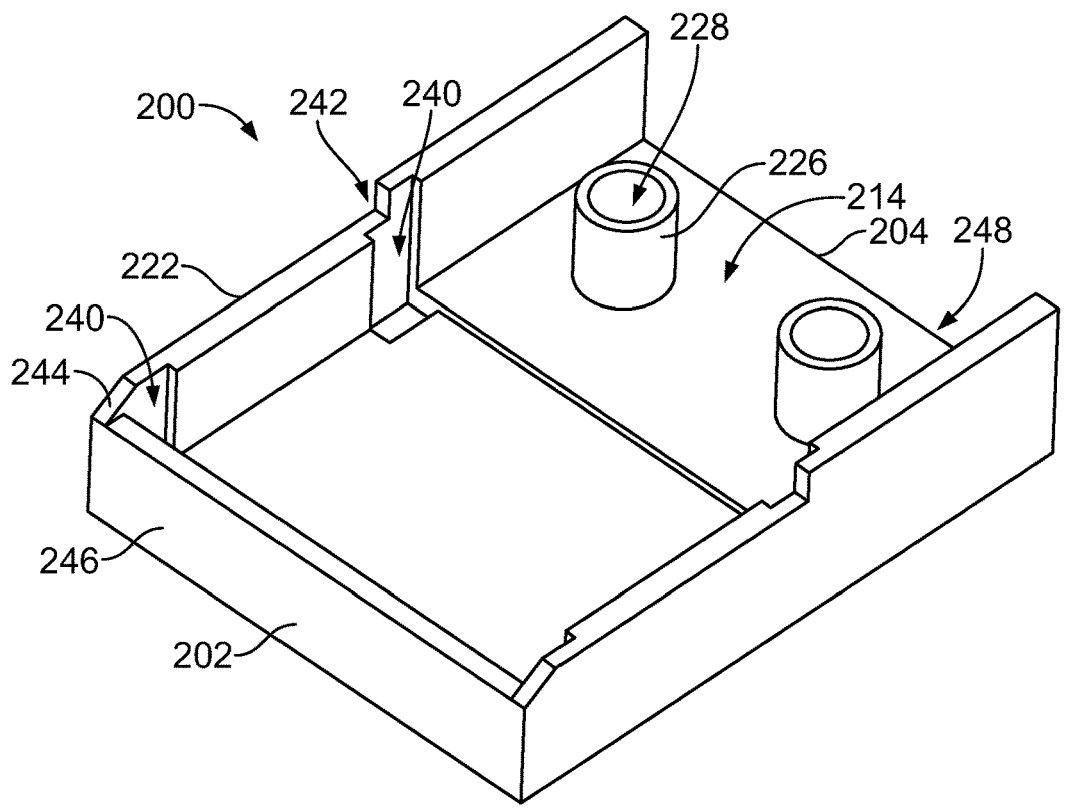
FIG. 9 is a perspective view of a shell of a housing of the power connector in accordance with an exemplary embodiment.

FIG. 9 is a perspective view of the shell 222 of the housing 200 in accordance with an exemplary embodiment. The shell 222 includes the terminal channel 214. The shell 222 includes the protrusions 226 extending into the terminal channel 214. The protrusions 226 include the openings 228 that receive the fastener 220 (shown in FIG. 3). The shell 222 includes slots 240 that receive portions of the power terminal 300 (shown in FIG. 3). For example, the slots 240 receive portions of the retainer clip 308. The shell 222 includes cutouts 242 along the top and the bottom that form portions of the mating slot 218. In an exemplary embodiment, the shell 222 includes a lead-in 244 at the front 202. In an exemplary embodiment, the shell 222 includes a front wall 246 at the front 202 and an opening 248 at the rear 204. The front wall 246 closes the terminal channel 214. The opening 248 provides a space for the power terminal 300 to exit the terminal channel 214.

Figure 10:
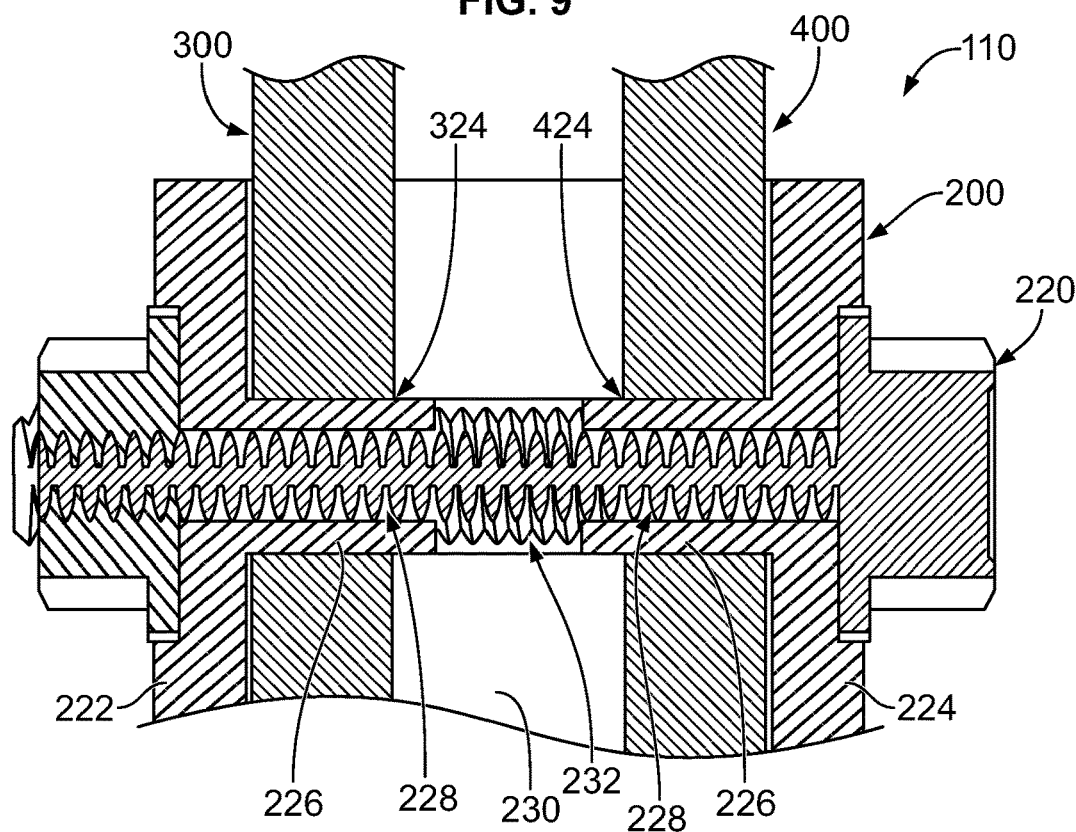
FIG. 10 is a cross-sectional view of a portion of the power connector in accordance with an exemplary embodiment.

FIG. 10 is a cross-sectional view of a portion of the power connector 110 in accordance with an exemplary embodiment. FIG. 10 illustrates the power connector 110 in an assembled state. The power terminals 300, 400 are received in the housing 200. The spacer 230 is positioned between the power terminals 300, 400. The protrusions 226 extend through the openings 324, 424 in the power terminals 300, 400 into the opening 232 in the spacer 230. The fastener 220 extends through the opening 228 and the protrusions 226. The fastener 220 is tightened to compress the shells 222, 224 against the power terminals 300, 400 to compress the power terminals 300, 400 against the spacer 230.

Figure 11:
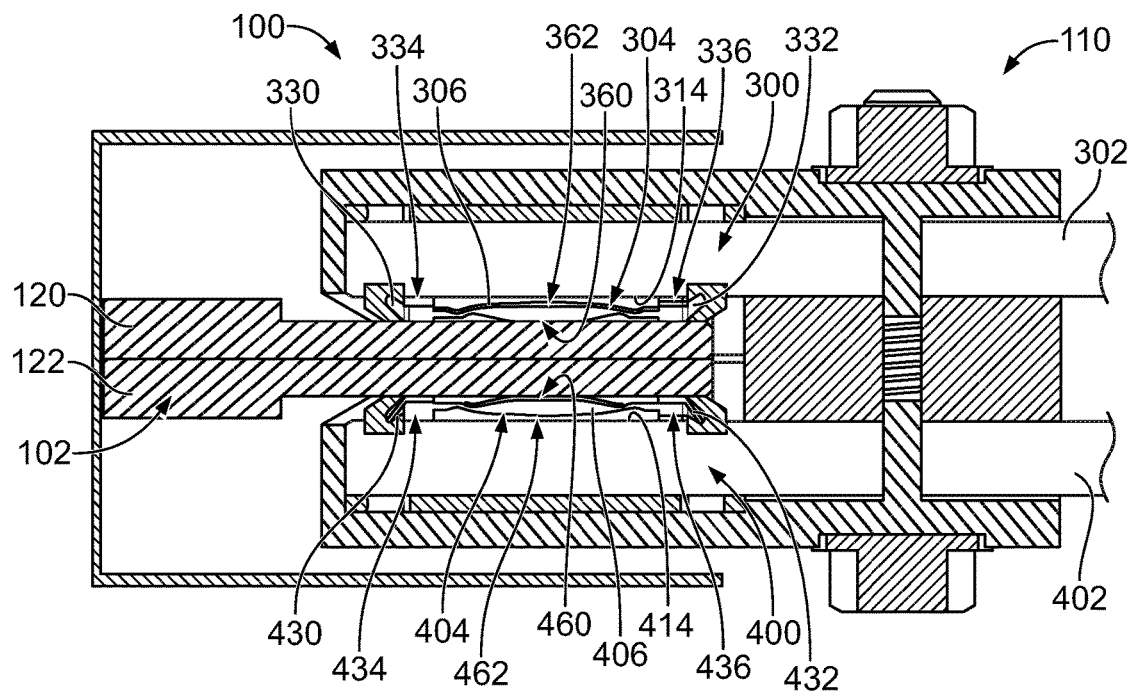
FIG. 11 is a cross-sectional view of the power system in accordance with an exemplary embodiment.

FIG. 11 is a cross-sectional view of the power system 100 in accordance with an exemplary embodiment. FIG. 11 illustrates the power connector 110 coupled to the bus bar 102. The first power terminal 300 is electrically connected to the first bus rail 120. The second power terminal 400 is electrically connected to the second bus rail 122. The first contacts 306 provide separable interfaces between the side of the first bus rail 120 and the inner side 314 of the first plate 302. The bus bar interfaces 360 are electrically connected to the first bus rail 120. The plate interfaces 362 are electrically connected to the first plate 302. Second contacts 406 provide separable interfaces between the side of the second bus rail 122 and an inner side 414 of a second plate 402. Bus bar interfaces 460 of the second contacts 406 are electrically connected to the second bus rail 122. Plate interfaces 462 of the second contacts 406 are electrically connected to the second plate 402.

The contacts 306, 406 extend longitudinally in a mating direction with the bus bar 102 between the front 330, 430 and the rear 332, 432 of the contact 306, 406. In an exemplary embodiment, each contact 306, 406 has multiple points of contact with the corresponding plate 302, 402. For example, the plate interfaces 362, 462 define points of contact and the mounting brackets 334, 336, 434, 436 define points of contact. The contacts 306, 406 are stamped and formed contacts being stamped from a relatively thin sheet of metal material. The contacts 306, 406 are flexible and configured to be spring biased against the bus bar 102 and the corresponding plate 302, 402 at the separable mating interfaces. While the contacts 306, 406 are much thinner than the plates 302, 402, many contacts 306, 406 are provided to define many electrical paths in parallel between the bus bar 102 and the plates 302, 402. As such, the contact arrays 304, 404 are configured to convey high current between the bus bar 102 and the plates 302, 402. The plates 302, 402 are thick metal plates configured to convey high current to the power elements 106 (shown in FIG. 12). For example, the plates 302, 402 may have a thickness at least 10 times a thickness of the contacts 306, 406. The power terminals 300, 400 may have a current rating of at least 400 amps in various embodiments. Optionally, the power terminals 300, 400 may have a current rating of at least 500 amps.

Figure 12:
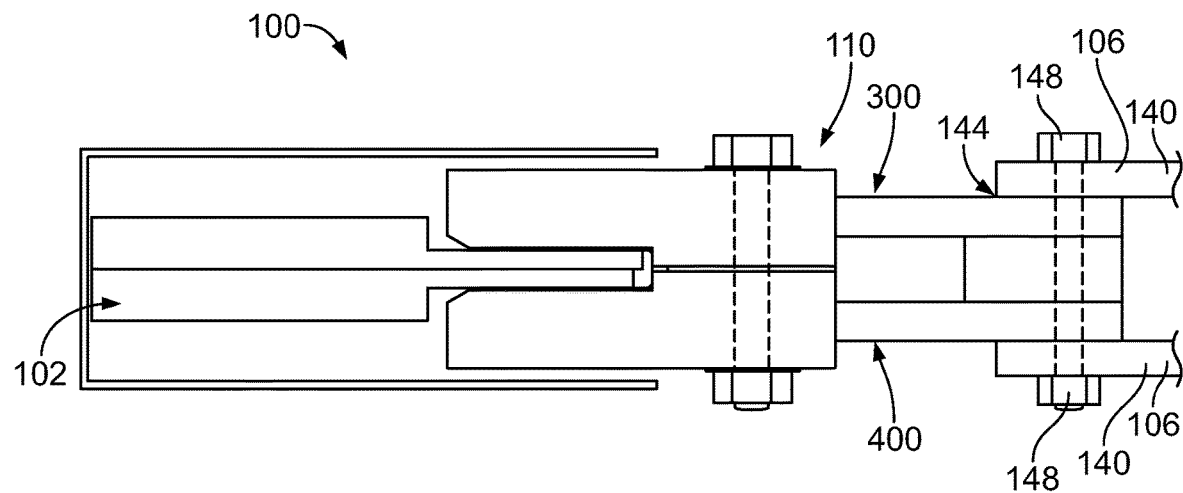
FIG. 12 is a top view of the power system in accordance with an exemplary embodiment.

FIG. 12 is a top view of the power system 100 in accordance with an exemplary embodiment. FIG. 12 illustrates the power connector 110 coupled to the bus bar 102. FIG. 12 illustrates the power connector 110 coupled to the power elements 106. In an exemplary embodiment, the power terminals 300, 400 are mechanically and electrically connected to the plates 140 of the power elements 106 at the mating interfaces 144 using the fasteners 148.

Figure 13:
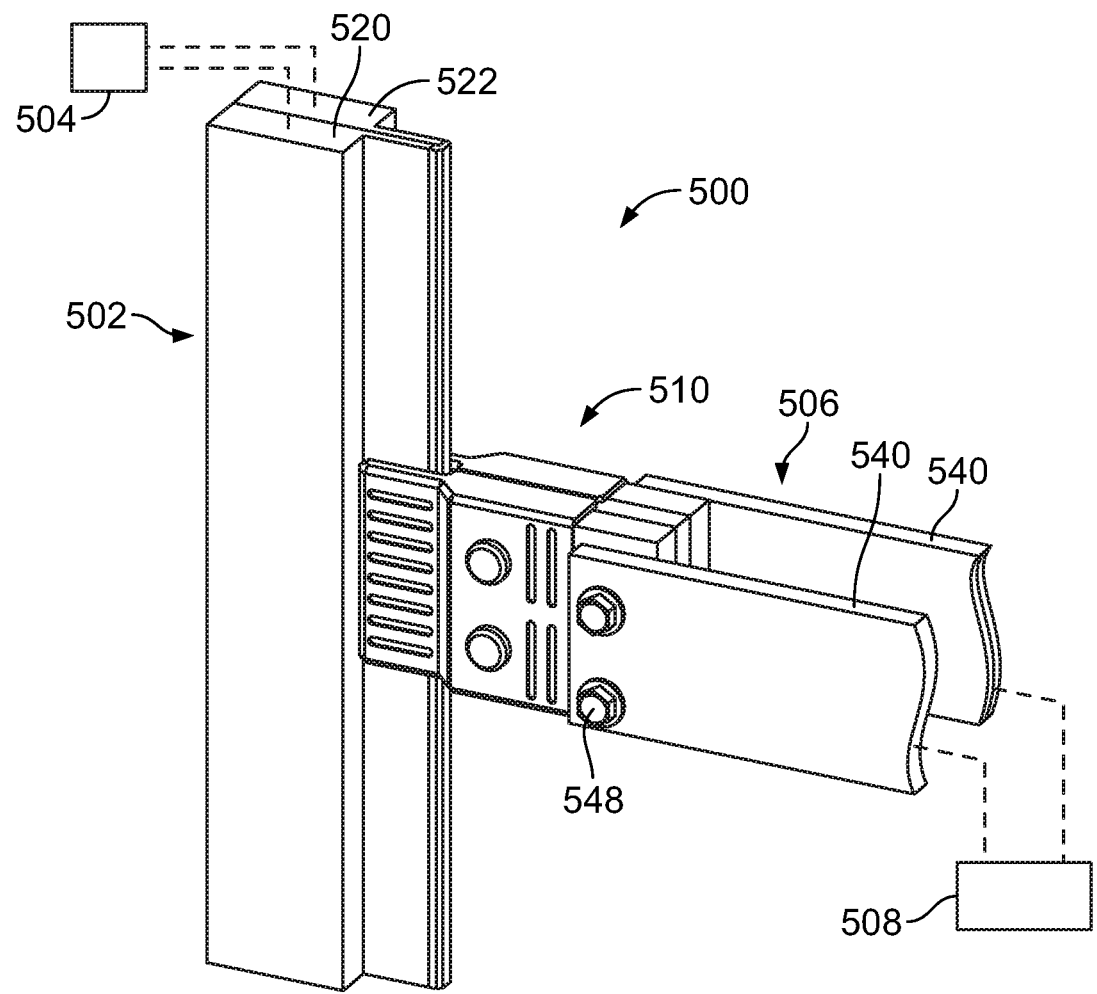
FIG. 13 illustrates a power system in accordance with an exemplary embodiment.

FIG. 13 illustrates a power system 500 in accordance with an exemplary embodiment. The power system 500 is a low-profile power system having a thinner profile than the power system 100 (shown in FIG. 1). The power system 500 includes a bus bar 502 electrically connected to a component 504 and one or more power elements 506 electrically connected to a component 508. A power connector 510 electrically connects the power elements 506 to the bus bar 502. In various embodiments, the power connector 510 may be used as a supply power connector to supply power to the bus bar 502. In other embodiments, the power connector 510 may be used as a tap power connector to tap into a power supply of the distribution bus bar 502.

The bus bar 502 includes a first bus rail 520 and a second bus rail 522. For example, the first bus rail 520 may be a positive rail and the second bus rail 522 may be a negative rail. The bus bar 502 may include a cover (not shown) that covers the bus rails 520, 522. In an exemplary embodiment, each bus rail 520, 522 includes a metal plate having sides extending to a mating edge. The power connector 510 is coupled to the mating edges at the sides of the bus rails 520, 522.

In the illustrated embodiment, the power elements 506 include metal plates 540. The metal plate 540 may be a bus bar. Fasteners 548 mechanically and electrically secure the power element 506 and the power connector 510. In various alternative embodiments, the power elements 506 may be power wires configured to be terminated to the power connector 510 rather than a metal plate.

Figure 14:
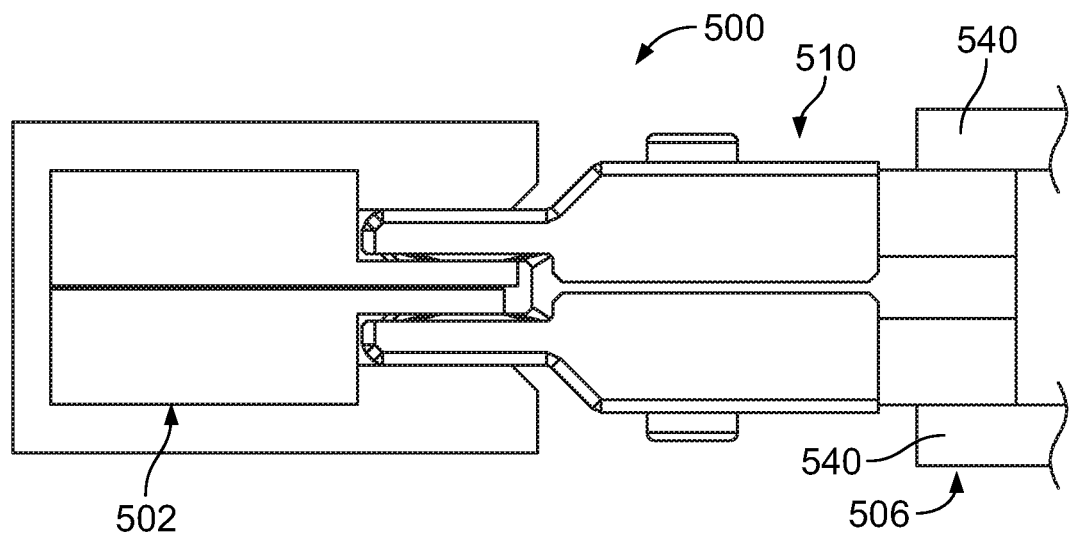
FIG. 14 is a top view of the power system in accordance with an exemplary embodiment.

FIG. 14 is a top view of the power system 500 in accordance with an exemplary embodiment. FIG. 14 illustrates the power connector 510 coupled to the bus bar 502. FIG. 14 illustrates the power connector 510 coupled to the power elements 506. In an exemplary embodiment, the power connector 510 electrically connects the bus rails 520, 522 of the bus bar 502 to the plates 540 of the power elements 506.

Figure 15:
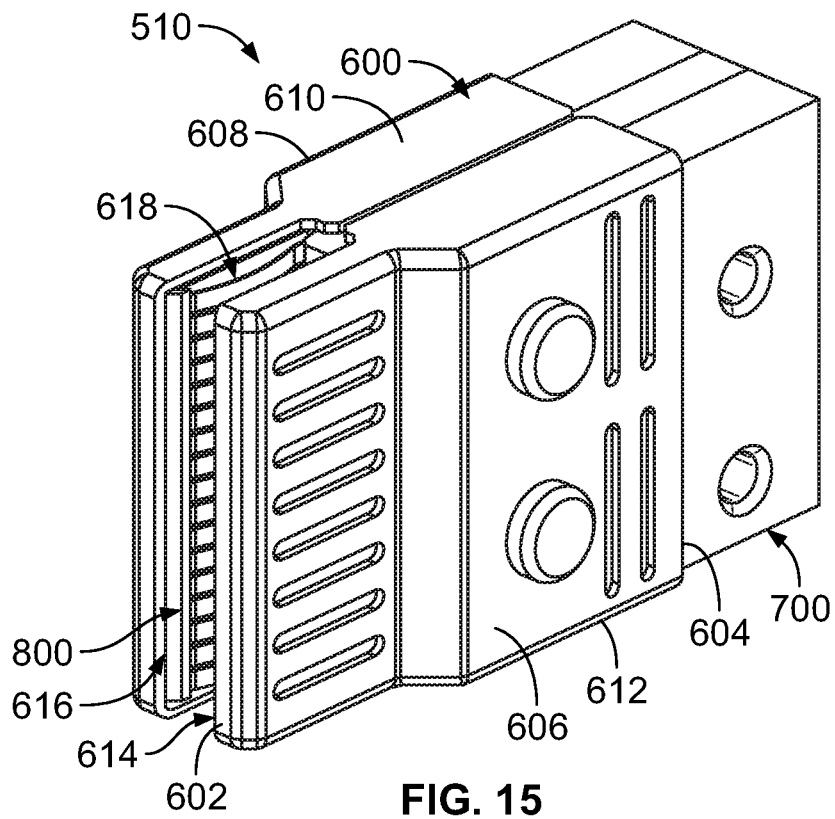
FIG. 15 is a front perspective view of a left side of the power connector in accordance with an exemplary embodiment.
Figure 16:
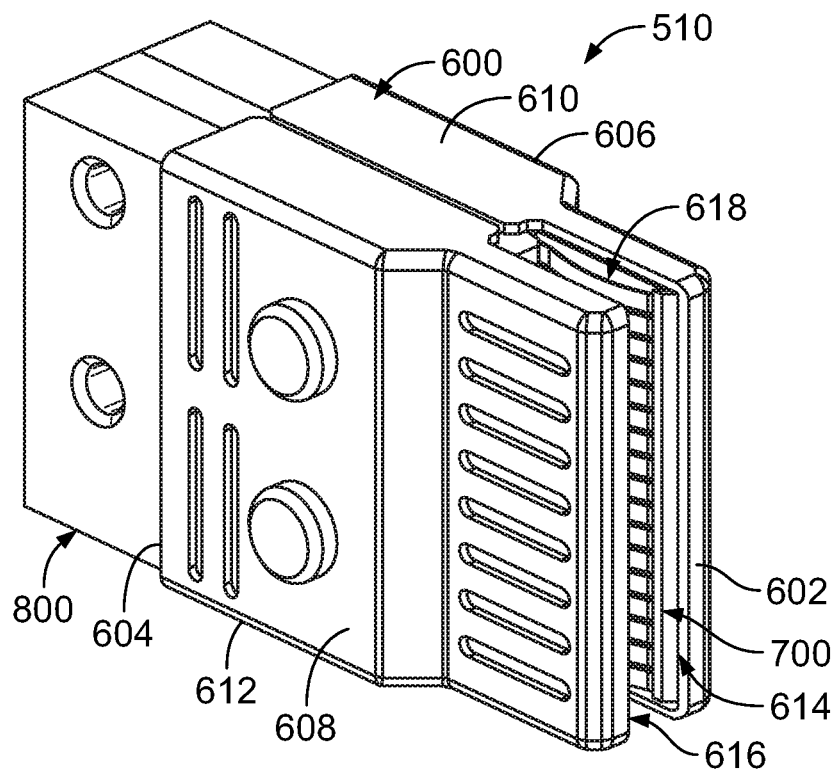
FIG. 16 is a front perspective view of a right side of the power connector in accordance with an exemplary embodiment.

FIG. 15 is a front perspective view of a left side of the power connector 510 in accordance with an exemplary embodiment. FIG. 16 is a front perspective view of a right side of the power connector 510 in accordance with an exemplary embodiment. The power connector 510 includes a housing 600 holding a first power terminal 700 and a second power terminal 800. The first power terminal 700 is configured to be electrically connected to the first bus rail 520 (shown in FIG. 13). The second power terminal 800 is configured to be electrically connected to the second bus rail 522 (shown in FIG. 13).

The housing 600 has a front 602, a rear 604, a first side 606, a second side 608, a first end 610, and a second end 612. In the illustrated embodiment, the housing 600 is generally box-shaped; however, the housing 600 may have other shapes in alternative embodiments. The housing 600 includes a first terminal channel 614 that receives the first power terminal 700 and a second terminal channel 616 that receives the second power terminal 800. The power terminals 700, 800 extend from the housing 600 through the rear 604.

In an exemplary embodiment, the housing 600 includes a mating slot 618 at the front 602. The mating slot 618 is vertically oriented through the housing 600. The mating slot 618 is open at the front 602 to receive the bus bar 502. The first and second power terminals 700, 800 extend to the mating slot 618 to interface with the bus bar 502.

Figure 17:
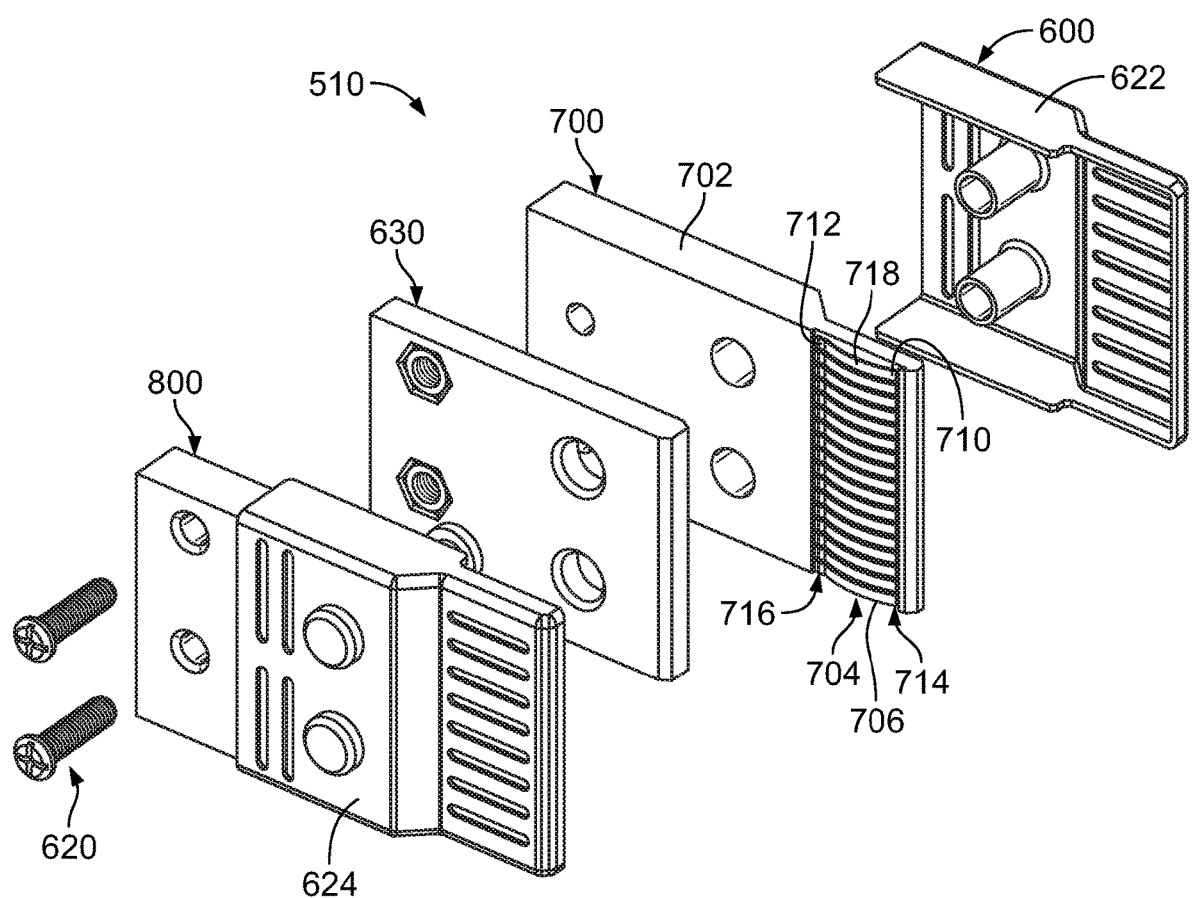
FIG. 17 is an exploded view of the power connector in accordance with an exemplary embodiment.

FIG. 17 is an exploded view of the power connector 510 in accordance with an exemplary embodiment. In an exemplary embodiment, the housing 600 is a multipiece housing configured to be assembled together using fasteners 620, such as a threaded fastener, a rivet, or another type of fastener. For example, the housing 600 includes a first shell 622 and a second shell 624 that receive the power terminals 700, 800.

In an exemplary embodiment, the power connector 510 includes a spacer 630 positioned between the first power terminal 700 and the second power terminal 800. The spacer 630 is manufactured from a dielectric material, such as a plastic material, a rubber material, and the like. The spacer 630 electrically isolates the first power terminal 700 from the second power terminal 800. The spacer 630 is sandwiched between the power terminals 700, 800 and the shells 622, 624 when the power connector 510 is assembled and the fasteners 620 are tightened.

The power terminal 700 includes a plate 702 and a contact array 704 of contacts 706 discrete from and coupled to the plate 702. The plate 702 is a metal plate, such as a copper plate. Optionally, the plate 702 may be a planar rectangular plate; however, the plate 702 may have other shapes, including bends, steps, and the like, in alternative embodiments.

The contacts 706 are arranged in a stacked configuration. In an exemplary embodiment, the contacts 706 are stamped and formed contacts. In an exemplary embodiment, the contacts 706 are spring contacts having ends 710, 712 coupled to the plate 702. The ends 710, 712 may be clipped into pockets 714, 716 of the plate 702. The ends 710, 712 may be welded or otherwise secured to the plate 702. The contacts 706 each have a spring beam 718 bowed between the ends 710, 712. The spring beam 718 may have a convex shape. The spring beam 718 is spaced apart from the plate 702 and flexible toward the plate 702 during mating with the bus bar 502. The power terminal 800 includes similar contacts having spring beams (shown in FIG. 15). Other types of contacts may be provided for the power terminals 700, 800 in alternative embodiments.

It is to be understood that the above description is intended to be illustrative, and not restrictive. For example, the above-described embodiments (and/or aspects thereof)

may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A power connector comprising:
   a housing having a front and a rear, the housing having a first side and a second side between the front and the rear, the housing having a first end and a second end between the front and the rear, the housing having a mating slot at the front configured to receive a bus bar, the housing having a first terminal channel between the slot and the first side and a second terminal channel between the slot and the second side;
   a first power terminal received in the first terminal channel, the first power terminal having a first plate extending from the slot through the rear of the housing to an exterior of the housing for termination to a first power element, the first power terminal having a first contact array of first contacts discrete from and coupled to the first plate, each first contact having a plate interface electrically coupled to the first plate and a bus bar interface configured to be electrically coupled to a first rail of the bus bar, each first contact having a first end and a second end, the first end defining the plate interface, the second end defining the bus bar interface, the first end being curved, the second end being curved, the first contacts being arranged along a first side of the slot for interfacing with the bus bar; and
   a second power terminal received in the second terminal channel, the second power terminal having a second plate extending from the slot through the rear of the housing to the exterior of the housing for termination to a second power element, the second power terminal having a second contact array of second contacts discrete from and coupled to the second plate, each second contact having a plate interface electrically coupled to the second plate and a bus bar interface configured to be electrically coupled to a second rail of the bus bar, each second contact having a first end and a second end, the first end defining the plate interface, the second end defining the bus bar interface, the first end being curved, the second end being curved, the second contacts being arranged along a second side of the slot for interfacing with the bus bar.

2. The power connector of claim 1, wherein the first contacts extend longitudinally in a mating direction with the bus bar between a front and a rear of each first contact and the second contacts extend longitudinally in a mating direction with the bus bar between a front and a rear of each second contact.

3. The power connector of claim 1, wherein each first contact includes at least two points of contact with the first plate and each second contact includes at least two points of contact with the second plate.

4. The power connector of claim 1, wherein the first contact array includes a first retainer clip holding each of the first contacts, the first retainer clip being secured to the first plate, the second contact array including a second retainer clip holding each of the second contacts, the second retainer clip being secured to the second plate.

5. The power connector of claim 1, further comprising a dielectric spacer between the first plate and the second plate, the dielectric spacer being sandwiched between the first plate and the second plate.

6. The power connector of claim 1, wherein the housing includes a first shell and a second shell separate and discrete from the first shell, the first shell being secured to the second shell by fasteners passing through the first plate and the second plate.

7. The power connector of claim 1, wherein the first plate includes a first opening and the second plate includes a second opening, the housing includes a first protrusion extending into the first opening and a second protrusion extending into the second opening, the power connector further comprising a fastener passing through the first and second protrusions and passing through the first and second openings.

8. The power connector of claim 1, wherein the first plate includes an inner surface facing the slot, the plate interfaces of the first contacts engaging the inner surface of the first plate, the second plate including an inner surface facing the slot, the plate interfaces of the second contacts engaging the inner surface of the second plate.

9. The power connector of claim 8, wherein the first contacts include front feet and rear feet mounted to the inner surface of the first plate on opposite sides of the plate interfaces of the first contacts, the second contacts including front feet and rear feet mounted to the inner surface of the second plate on opposite sides of the plate interfaces of the second contacts.

10. The power connector of claim 1, wherein the first contacts are louvered contacts arranged at a non-orthogonal angle to the first plate and the second contacts are louvered contacts arranged at a non-orthogonal angle to the second plate.

11. The power connector of claim 1, wherein the plate interfaces of the first contacts are offset from the bus bar interfaces of the first contacts and the plate interfaces of the second contacts are offset from the bus bar interfaces of the second contacts.

12. The power connector of claim 1, wherein the housing has a height of at most 48 mm between the first end and the second end.

13. The power connector of claim 1, wherein the mating slot is vertically oriented configured to receive a vertically oriented bus bar, the mating slot being open at the front, being open at the first end, and being open at the second end.

14. The power connector of claim 1, wherein the first plate includes an opening proximate a rear of the first plate configured to receive a fastener for mating the first plate to a first power rail, the second plate including an opening proximate a rear of the second plate configured to receive a fastener for mating the second plate to a second power rail.

15. A power connector comprising:
   a housing having a front and a rear, the housing having a first side and a second side between the front and the rear, the housing having a first end and a second end between the front and the rear, the housing having a mating slot at the front configured to receive a bus bar, the housing having a first terminal channel between the slot and the first side and a second terminal channel between the slot and the second side:
   a first power terminal received in the first terminal channel, the first power terminal having a first plate extending from the slot through the rear of the housing to an exterior of the housing for termination to a first power element, the first power terminal having a first contact array of first contacts discrete from and coupled to the first plate, each first contact having a plate interface electrically coupled to the first plate and a bus bar interface configured to be electrically coupled to a first rail of the bus bar, the first contacts being arranged along a first side of the slot for interfacing with the bus bar; and
   a second power terminal received in the second terminal channel, the second power terminal having a second plate extending from the slot through the rear of the housing to the exterior of the housing for termination to a second power element, the second power terminal having a second contact array of second contacts discrete from and coupled to the second plate, each second contact having a plate interface electrically coupled to the second plate and a bus bar interface configured to be electrically coupled to a second rail of the bus bar, the second contacts being arranged along a second side of the slot for interfacing with the bus bar;
   wherein the bus bar interface of the first power terminal defines a separable mating interface with a first rail of the bus bar and the bus bar interface of the second power terminal defines a separable mating interface with a second rail of the bus bar configured to convey greater than 400 amps.

16. A power connector comprising:
   a housing having a front and a rear, the housing having a first side and a second side between the front and the rear, the housing having a first end and a second end between the front and the rear, the housing having a mating slot at the front configured to receive a bus bar, the housing having a first terminal channel between the slot and the first side and a second terminal channel between the slot and the second side;
   a first power terminal received in the first terminal channel, the first power terminal having a first plate extending from the slot through the rear of the housing to an exterior of the housing for termination to a first power element, the first power terminal having a first contact array of first contacts discrete from and coupled to the first plate, each first contact having a plate interface electrically coupled to the first plate and a bus bar interface configured to be electrically coupled to a first rail of the bus bar, the first contacts being arranged along a first side of the slot for interfacing with the bus bar; and
   a second power terminal received in the second terminal channel, the second power terminal having a second plate extending from the slot through the rear of the housing to the exterior of the housing for termination to a second power element, the second power terminal having a second contact array of second contacts discrete from and coupled to the second plate, each second contact having a plate interface electrically coupled to the second plate and a bus bar interface configured to be electrically coupled to a second rail of the bus bar, the second contacts being arranged along a second side of the slot for interfacing with the bus bar;
   wherein the first contacts are stamped and formed contacts and the first plate has a thickness at least 10 times a thickness of the first contacts, the second contacts being stamped and formed contacts and the second plate having a thickness at least 10 times a thickness of the second contacts.

17. A power connector comprising:
   a housing having a front and a rear, the housing having a first side and a second side between the front and the rear, the housing having a first end and a second end between the front and the rear, the housing having a vertically oriented mating slot configured to receive a vertically oriented bus bar, the mating slot being open at the front, being open at the first end, and being open at the second end, the housing having a first terminal channel between the slot and the first side and a second terminal channel between the slot and the second side;
   a first power terminal received in the first terminal channel, the first power terminal having a first plate extending from the slot through the rear of the housing to an exterior of the housing for termination to a first power element, the first power terminal having a first contact array of first contacts discrete from and coupled to the first plate, each first contact having a plate interface electrically coupled to the first plate and a bus bar interface configured to be electrically coupled to a first rail of the bus bar such that the first contact array has a plurality of points of contact with the first plate and a plurality of points of contact with the bus bar, the first contacts being louvered contacts arranged at a non-orthogonal angle to the first plate, the first contacts being arranged along a first side of the slot for interfacing with the bus bar; and
   a second power terminal received in the second terminal channel, the second power terminal having a second plate extending from the slot through the rear of the housing to the exterior of the housing for termination to a second power element, the second power terminal having a second contact array of second contacts discrete from and coupled to the second plate, each second contact having a plate interface electrically coupled to the second plate and a bus bar interface configured to be electrically coupled to a second rail of the bus bar such that the second contact array has a plurality of points of contact with the second plate and a plurality of points of contact with the bus bar, the second contacts being louvered contacts arranged at a non-orthogonal angle to the second plate, the second contacts being arranged along a second side of the slot for interfacing with the bus bar;
   wherein the bus bar interface of the first power terminal defines a separable mating interface with a first rail of the bus bar and the bus bar interface of the second power terminal defines a separable mating interface with a second rail of the bus bar configured to convey greater than 400 amps.

18. The power connector of claim 17, wherein the housing has a height of at most 48 mm between the first end and the second end.

19. The power connector of claim 17, wherein each first contact has a first end and a second end, the first end defining the plate interface, the second end defining the bus bar interface, the first end being curved, the second end being curved, and wherein each second contact has a first end and a second end, the first end defining the plate interface, the second end defining the bus bar interface, the first end being curved, the second end being curved.

20. The power connector of claim 17, wherein the first contacts are stamped and formed contacts and the first plate has a thickness at least 10 times a thickness of the first contacts, the second contacts being stamped and formed contacts and the second plate having a thickness at least 10 times a thickness of the second contacts.

21. A power system for a bus bar having a first bus rail and a second bus rail, the power system comprising:
- a first power element having a first mating interface;
- a second power element having a second mating interface; and
- a power connector configured to be mated to the first bus rail and the second bus rail, the power connector comprising:
  - a housing having a front and a rear, the housing having a first side and a second side between the front and the rear, the housing having a first end and a second end between the front and the rear, the housing having a mating slot at the front configured to receive the bus bar, the housing having a first terminal channel between the slot and the first side and a second terminal channel between the slot and the second side;
  - a first power terminal received in the first terminal channel, the first power terminal having a first plate extending from the slot through the rear of the housing to an exterior of the housing for termination to the first power element at the first mating interface, the first power terminal having a first contact array of first contacts discrete from and coupled to the first plate, each first contact having a plate interface electrically coupled to the first plate and a bus bar interface configured to be electrically coupled to the first rail of the bus bar, the first contacts being louvered contacts arranged at a non-orthogonal angle to the first plate, the first contacts being arranged along a first side of the slot for interfacing with the bus bar; and
  - a second power terminal received in the second terminal channel, the second power terminal having a second plate extending from the slot through the rear of the housing to the exterior of the housing for termination to the second power element at the second mating interface, the second power terminal having a second contact array of second contacts discrete from and coupled to the second plate, each second contact having a plate interface electrically coupled to the second plate and a bus bar interface configured to be electrically coupled to the second rail of the bus bar, the second contacts being louvered contacts arranged at a non-orthogonal angle to the second plate, the second contacts being arranged along a second side of the slot for interfacing with the bus bar;
  wherein the first power terminal electrically connects the first power element to the first rail and the second power terminal electrically connects the second power element to the second rail at a separable mating interface with the bus bar.

* * * * *